(12) United States Patent
Baker et al.

(10) Patent No.: US 11,005,075 B2
(45) Date of Patent: May 11, 2021

(54) OLED LIGHT EXTRACTION USING NANOSTRUCTURED COATINGS

(71) Applicant: Corning Incorporated, Corning, NY (US)

(72) Inventors: David Eugene Baker, Bath, NY (US); Li Liu, Painted Post, NY (US); Pamela Arlene Maurey, Savona, NY (US); Robert Adam Modavis, Painted Post, NY (US); Daniel Aloysius Nolan, Corning, NY (US); Wageesha Senaratne, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/140,893

(22) Filed: Sep. 25, 2018

(65) Prior Publication Data

US 2019/0027706 A1    Jan. 24, 2019

Related U.S. Application Data

(62) Division of application No. 15/274,180, filed on Sep. 23, 2016, now Pat. No. 10,109,821.

(Continued)

(51) Int. Cl.
*H01L 51/52* (2006.01)
*H01L 51/00* (2006.01)
(Continued)

(52) U.S. Cl.
CPC .......... *H01L 51/5275* (2013.01); *G02B 1/111* (2013.01); *G02B 5/0242* (2013.01);
(Continued)

(58) Field of Classification Search
None
See application file for complete search history.

(56) References Cited

U.S. PATENT DOCUMENTS 7,432,649 B2  10/2008  West
8,575,834 B2  11/2013  Wada et al.
(Continued)

FOREIGN PATENT DOCUMENTS

CN    1823433 A    8/2006
CN    102201545 A   9/2011
(Continued)

OTHER PUBLICATIONS

International Searching Authority Invitation to Pay Additional Search Fees PCT/US2016/053524 dated Dec. 5, 2016, European Patent Office.

(Continued)

*Primary Examiner* — Jack S Chen

(57) ABSTRACT

An apparatus for light diffraction and an organic light emitting diode (OLED) incorporating the light diffraction apparatus is disclosed. An apparatus for light diffraction may comprise an optional planarization layer, a transparent substrate, a waveguide layer. The planarization layer may have a refractive index of $n_s$. The transparent substrate may have a refractive index of $n_g$. The waveguide layer may have a refractive index $n_w$ distributed over of the transparent substrate. The waveguide layer may comprise a binding matrix, at least one nanoparticle. The waveguide layer may be interposed between the transparent substrate and the optional planarization layer.

20 Claims, 6 Drawing Sheets

Related U.S. Application Data

(60) Provisional application No. 62/222,447, filed on Sep. 23, 2015.

(51) Int. Cl.
  *G02B 1/111* (2015.01)
  *G02B 5/02* (2006.01)

(52) U.S. Cl.
  CPC ........ *G02B 5/0247* (2013.01); *H01L 51/0096* (2013.01); *H01L 51/5268* (2013.01); *H01L 51/5293* (2013.01); *H01L 2251/5369* (2013.01); *Y02E 10/549* (2013.01)

(56) References Cited

U.S. PATENT DOCUMENTS

| | | | |
|---|---|---|---|
| 8,659,221 B2 | 2/2014 | Jones et al. | |
| 2007/0114520 A1 | 5/2007 | Garditz et al. | |
| 2014/0091292 A1 | 4/2014 | Baker et al. | |
| 2014/0291656 A1 | 10/2014 | Gollier et al. | |
| 2016/0116696 A1* | 4/2016 | Modavis | G02B 6/12004 385/14 |
| 2016/0291236 A1 | 10/2016 | Baker et al. | |

FOREIGN PATENT DOCUMENTS

| | | |
|---|---|---|
| EP | 1445095 A1 | 8/2004 |
| EP | 1760802 A2 | 3/2007 |
| KR | 10-2013-0143547 A | 12/2013 |
| WO | 2014136723 A1 | 9/2014 |
| WO | 2015111351 A1 | 7/2015 |
| WO | 2016065101 A1 | 4/2016 |

OTHER PUBLICATIONS

Glass Substrates for OLED Lighting with High Out-coupling Efficiency Asahi Glass research, SID 2009.
Advanced Glass Substrate for the Enhancement of OLED Lighting Out-coupling Efficiency, Asahi, SID, 2013.
Novel Light-Scattering Glass Substrate for the Enhancement of OLED Lighting Out-coupling Efficiency, Asahi, SID, 2012.
English Translation of CN2016800599477 Office Action dated Apr. 8, 2020; 12 Pages; Chinese Patent Office.
Chinese Patent Application No. 201680059947.7, Office Action dated Dec. 24, 2020, 5 pages (English Translation Only); Chinese Patent Office.

* cited by examiner

# OLED LIGHT EXTRACTION USING NANOSTRUCTURED COATINGS

CROSS-REFERENCE TO RELATED APPLICATIONS

This application is a Divisional of U.S. application Ser. No. 15/274,180 filed on Sep. 23, 2016, which claims the benefit of priority under 35 U.S.C. § 119 to U.S. Provisional Application Ser. No. 62/222,447 filed on Sep. 23, 2015, the content of which is relied upon and incorporated herein by reference in its entirety.

SUMMARY

The present disclosure relates generally to organic light emitting diodes (OLEDs) and display devices that include OLEDs, more specifically, to a method and device of OLED extraction layer using nanostructured coating.

Optionally, an organic light emitting diode (OLED) may comprise a diode superstructure and a light diffracting substructure. The light diffracting substructure may provide a scattering cross section of light from the diode superstructure. The diode superstructure may comprise a cathode, an anode, and an organic light emitting semiconductor material interposed between the cathode and the anode. The light diffracting substructure may comprise a transparent substrate having a refractive index of $n_g$, an optional planarization layer having a refractive index of $n_s$, a waveguide layer having a refractive index $n_w$ distributed over the transparent substrate. The waveguide layer may comprise a binding matrix and at least one nanoparticle. The waveguide layer may be interposed between the transparent substrate and the planarization layer.

In another embodiment, an organic light emitting diode (OLED) may comprise a diode superstructure and a light diffraction substructure. The light diffraction substructure may provide a scattering cross section of light from the diode superstructure. The diode superstructure may comprise a cathode, an anode, and an organic light emitting semiconductor material interposed between the cathode and the anode. The light diffraction substructure may comprise a transparent substrate having a refractive index of $n_g$, a waveguide layer having a refractive index of $n_w$, distributed over the transparent substrate. The waveguide layer may comprises a binding matrix having an affinity to the transparent substrate, wherein the waveguide layer comprises at least one nanoparticle, wherein the $n_w$ is greater than $n_g$.

In a further embodiment, an apparatus for light diffraction may comprise an optional planarization layer having a refractive index of $n_s$, a transparent substrate having a refractive index of $n_g$, a waveguide layer having a refractive index $n_w$ distributed over of the transparent substrate. The waveguide layer may comprise a binding matrix and, at least one nanoparticle. The waveguide layer is interposed between the transparent substrate and the optional planarization layer. The optional planarization layer may be made of a hybrid organic inorganic material.

Additional features and advantages of the present disclosure will be set forth in the detailed description, which follows, and in part will be readily apparent to those skilled in the art from that description or recognized by practicing the embodiments described herein, including the detailed description, which follows, the claims, and the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF SEVERAL VIEWS OF THE DRAWINGS

The following is a description of the figures in the accompanying drawings. The figures are not necessarily to scale, and certain features and certain views of the figures may be shown exaggerated in scale or in schematic in the interest of clarity or conciseness.

Figure 1:
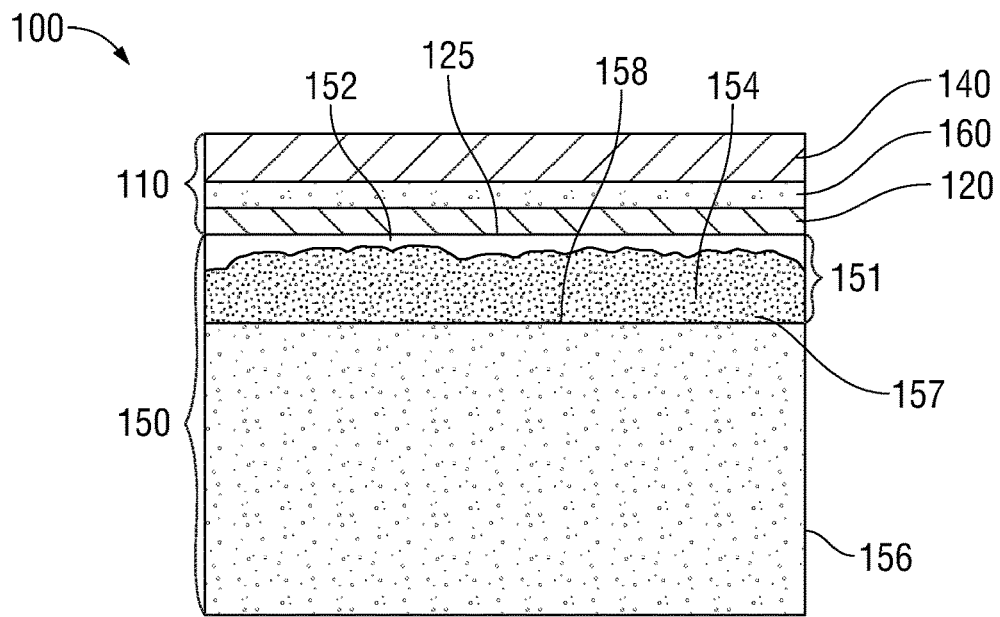
FIG. 1 is a schematic illustration of a layered structure of an OLED according to one embodiment of the present disclosure.

The foregoing summary, as well as the following detailed description of certain inventive techniques, will be better understood when read in conjunction with the figures. It should be understood that the claims are not limited to the arrangements and instrumentality shown in the figures. Furthermore, the appearance shown in the figures is one of many ornamental appearances that can be employed to achieve the stated functions of the apparatus.

DETAILED DESCRIPTION

The present disclosure can be understood more readily by reference to the following detailed description, drawings, examples, and claims, and their previous and following description. However, before the present compositions, articles, devices, and methods are disclosed and described, it is to be understood that this disclosure is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the disclosure is provided as an enabling teaching of the disclosure in its currently known embodiments. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed, specific reference of each various individual and collective combinations and permutation of these compounds may not be explicitly disclosed, yet each is specifically contemplated and described herein.

Reference will now be made in detail to the present preferred embodiment(s), examples of which are illustrated in the accompanying drawings. The use of a particular reference character in the respective views indicates the same or like parts.

Broadly, the present disclosure relates to OLEDs, and more specifically, a high index material nanostructure containing a light diffraction layer that enables internal and external OLED light diffraction. Extracting light from OLED devices is essential for operation efficiency. As much as about 80% of the generated light can be trapped within the organic layers and glass substrate to be subsequently absorbed by the metallic cathode. Coupling trapped light in the OLED can be achieved through a planarizing or smoothing layer to an index matched extracting waveguide. An important approach is to form discrete extracting waveguides so that light is extracted from the OLED layers to this discrete waveguide, and is then extracted from these discrete guides at their termination point.

In this disclosure, high index nanoparticles are mixed with materials used for the planarization layer, such as silicate or organosilicon material, and then coated on to glass substrates where the structure morphology enables the light extraction due to the nanoparticles effective refractive index, thickness, volumetric scattering and surface roughness elements. Surface roughness is measured by atomic force microscopy (AFM) and reported as RMS (root mean square). AFM was used to image 30 um×30 um and 2 um×2 um scans to show roughness over longer and shorter length scales.

The effective refractive index of a composite material may be calculated by using Maxwell Garnett formula. Alternatively, the effective refractive index may be calculated by $n_{eff}=sqrt(f \cdot n_1^2+(1-f)n_2^2)$, f is volume fraction based on SEM cross section and image analysis.

Creating a mixture of the high index nanoparticles with silicate or organosilicon (siloxanes, silsesquioxanes) binder material may allow one to change the volume fraction of the high index material, create an appropriate index difference, assist in particle adhesion and adhesion to the substrate. Most important aspects of a mixed system are the removal of trapped gas from the porosity and increase in the ease of planarization of the nanoparticle mixed structure. Silicate or organosilicon compound are typically fairly temperature stable (>450° C.), has low organic burn off and is cured by condensation reaction forming water as the byproduct.

In this disclosure, as one advantage, high index nanoparticles are mixed with materials used for the planarization layer, such as silicate or organosilicon material in various ratios between the nanoparticles/matrix, where the particle content can be changed from about 10% to about 50%. Lower particle content would result in having more binder layer in the matrix, thus avoiding the need to add a planarizer layer.

The refractive index and geometry of this nanostructure on glass enables excellent light diffraction from an OLED super-layer. The refractive index and the thickness of the nanostructured waveguide match well the index and thickness of the OLED super-layer so that light can easily couple out from the OLED layer to the nanostructured waveguide, The morphology of this nanostructure extracts guided light within it very efficiently to the environment since it includes volumetric light scattering elements and a surface scattering roughness. Indium tin oxide (ITO) deposition or subsequent OLED material deposition steps may remove trapped gas from the porosity and reduces pinhole formation.

The present disclosure provides mixed systems where the $ZrO_2$% is from about 18% to about 30% in the matrix, that are not so rough that they can be smoothed with a smoothing layer thickness less than 0.3 microns. The smoothing layer—OLED interface is not too rough nor does it include high lateral surface roughness frequencies as to induce significant mode coupling of the transverse electric (TE) and transverse magnetic (TM) modes to the surface plasmon mode, which is a highly attenuated mode. But it does enable coupling among the guided modes to enable more efficient light diffraction.

This nanostructure with a smoothing layer enables a light extraction efficiency factors on the order of 3 using a surrogate measurement.

FIG. 1 is a schematic illustration of the layered structure of an OLED 100 according to one embodiment of the present disclosure. The illustrated organic light emitting diode 100 may comprise a diode superstructure 110 and a light diffraction substructure 150. The light diffraction substructure 150 can be used as a standalone apparatus for light diffraction. The diode superstructure 110 may comprise an anode 120, a cathode 140, and an organic light emitting semiconductor material 160 interposed between the anode 120 and the cathode 140. The light diffraction substructure 150 may comprise a transparent substrate 156, a light diffraction layer 151 distributed over a waveguide surface 158 of the transparent substrate 156. The diffraction layer 151 comprises a waveguide layer 154 and an optional planarization layer 152. The waveguide layer 154 is interposed between the transparent substrate 156 and the planarization layer 152. The waveguide layer 154 may have an affinity to the glass substrate. The transparent substrate 156 may be glass or plastic, for example.

The optional planarization layer 152 may have a refractive index of $n_s$. The transparent substrate 156 may have a refractive index of $n_g$, and a waveguide layer 154 may have a refractive index $n_w$ distributed over the transparent substrate 156. The waveguide layer 154 may include a binding matrix 157 and at least one nanoparticle. In some embodiments, $n_w$ is greater than $n_g$ and $n_w$ is greater than $n_s$. In some embodiments, the $|n_s - n_g|$ is less than or equal to 0.5.

In some embodiment, the apparatus for light diffraction may include an optional planarization layer 152, a transparent substrate 156, a waveguide layer 154. The planarization layer 152 may have a refractive index of $n_s$. The transparent substrate 156 may have a refractive index of $n_g$. The waveguide layer may have a refractive index $n_w$ distributed over of the transparent substrate 156. The waveguide layer may comprise a binding matrix 157, at least one nanoparticle. The waveguide layer 154 may be interposed between the transparent substrate 156 and the optional planarization layer 152. The binding matrix 157 may be hybrid organic inorganic compound. The hybrid organic inorganic compound may include silicate, borate, organosilyl compounds, such as polymerized polymethylsilsesquioxane. In some embodiments, the planarization layer 152 may be made of substantially the hybrid organic inorganic compound. In some embodiments, the planarization layer 152 may further include nanoparticles having from about 2 to 20 nm diameters. The nanoparticles may become agglomerate having sizes about 50-250 nm in some embodiments.

It is noted, however, that the anode 120 may be a transparent conductive oxide (TCO), like indium tin oxide (ITO), that is transparent to light emitted by the organic light emitting semiconductor material 160 and provide a suitable interface with the diode superstructure-engaging side 125 of the light diffraction substructure 150. Further, while the cathode 140 may comprise any conductive material that has the appropriate work function to match the light emitting material. For example, the cathode may comprise Ag, Au, Al, SM, Tm, Yb or bimetallic materials, such as Ca:Al, Eu:Yb, or Tm:Yb. The thickness of the cathode may be in the range of about 70-400 nm, about 70-300 nm, or about 70-200 nm. In some cases, when the cathode material thickness is below about 70 nm, the device may become bi-directional as light can escape from the cathode as well. This may be advantageous under certain circumstances where additional components are used to harvest the light escaping from the cathode. Therefore, some embodiments may comprise a cathode having a thickness of from about 10 nm to about 70 nm, less than about 70 nm, or a thickness such that more than greater than 1% of the light emitted from the OLED is emitted through the cathode.

It is noted that the thickness of the diode superstructure may be about 1.0 micron or less or, in some cases, about 0.5 micron or less. A thickness of waveguide layer may be thicker than that of the diode superstructure. In some embodiment, the thickness of the planarization layer may be less than about 0.5 microns. In further another embodiment, the thickness of the planarization layer may be less than about 0.3 microns.

The waveguide layer may have a surface roughness less than about 0.05 microns. In some embodiments, the waveguide layer may have surface roughness less than about 0.03 microns. In some embodiments, the waveguide layer may have surface roughness less than about 0.01 microns. In yet another embodiment, the nanoparticles may have surface roughness (RMS) about 0.05 microns.

For the light diffraction layer 151 comprising a waveguide layer 154 and a planarization layer 152, care should be taken to ensure that material selection enables the various parameters and characteristics described herein. For example, and not by way of limitation, it is contemplated that the waveguide layer 154 may comprise a binding matrix or a binding matrix composite. The binding matrix or binding matrix composite may comprise a material made for the planarization layer. The nanoparticles and binding matrix for the planarization layer may be collectively forming nanoparticle agglomerates. Alternatively, it is contemplated that the nanoparticles may comprise $TiO_2$, ZnO, $HfO_2$, $Ta_2O_5$, $Al_2O_3$ or their silicates, or combinations thereof. The materials for the planarization can have a refractive index substantially similar to the refractive index of the transparent substrate 156. For example, the materials for planarization layer may be provided as a "spin on glass." The materials for planarization layer may be characterized by relatively high crack resistance (low shrinkage after cure), may have the ability to fill nanoscale gaps, and may generally be thermally stable. In general, the materials for planarization layer is thermally stable up to approximately 450° C. in air. Beyond this temperature, the matrix materials may become thermally unstable and/or break down.

By way of example, and not limitation, the materials for planarization layer may be formed from one or more of: partially polymerized polymethylsilsesquioxane (e.g. T-12, 512B, T-11 spin on glass (Honeywell)), poly-dimethyl-siloxane, poly-diphenyl-siloxane, partially polymerized polysilsesquioxane, poly-methyl silsesquioxane (HardSil™ AM, Gelest Chemicals), and poly-phenyl-silsequioxane, poly-methyl-phenyl silsesquioxane (HardSil™ AP, Gelest), spin-on glass titanates (Ti-100, Ti-140, Ti-1000, Desert Silicon) and spin-on glass silica, titanate mixtures (Ti-452, Desert Silicon).

By way of example, and not limitation, the materials for planarization layer may be formed from one or more of: partially polymerized polymethylsilsesquioxane (e.g. T-12, 512B, T-spin on glass (Honeywell)), partially polymerized polysilsesquioxane, poly-methyl silsesquioxane (HardSil™ AM, Gelest Chemicals), and poly-phenyl-silsequioxane, poly-methyl-phenyl silsesquioxane (HardSil™ AP, Gelest), spin-on glass titanates (Ti-100, Ti-140, Ti-1000, Desert Silicon) and spin-on glass silica, titanate mixtures (Ti-452, Desert Silicon) mixed with various higher index nanoparticle dispersions such as anatase $TiO_2$ (15 wt %, 5-30 nm, Nanoamor) or $ZnO_2$ (NanoSunguard™ in water, Sigma).

Coating methods to produce the waveguide elements and/or layer include those methods known in the art that will produce a surface with desired properties, wherein waveguide element concentration and dispersant concentrations may be varied to provide the necessary concentration of waveguide elements in the end product. Such methods include, but are not limited to, dip coating, spin coating, screen printing, ink jet coating, spraying, vapor or particle deposition, roller coating or roll-to-roll processing, etc.

The light diffraction layer, including the waveguide layer on glass may be used for transparent projective display applications. An image projected onto such a coated glass sheet may scatter light from the surface to the viewer. In addition, these coated glass sheets can be laminated and remain functional since the index of the mixtures, such as the agglomerated particle index (on the order of 2) is significantly larger than glass or a laminating material, such as polyvinyl butyral (PVB).

The coatings that are only a few microns in thickness or thinner may result in high transmission. Also, the agglomerated size distribution may matter. The wide angle scattering resulting from sizes on the order of and less than the wavelength of light may enable a good transmitted background image and yet also a good projected image. Narrow angle scattering with a narrow distribution may blur the background image.

The coatings having the particle size distribution sizes are on the order of but not significantly larger than the wavelength of light and the number of agglomerated particles may result in low haze and good wavelength performance.

Again the particle distribution of the coatings may also result in good viewing angle. When the particle sizes get significantly larger than the wavelength of light, the viewing angle may narrow.

Minimal halo effect, an undesirable effect, can exist but is of low intensity. This can be minimized by minimizing the number of small agglomerated particles. Smaller particles scatter light at very narrow angles. This leads to trapping and then diffraction of light. For optimum performance and in transmission mode, the particles should be about 200 nm<R<400 nm.

In some embodiments, the nanoparticles may have an average diameter of from about 5 nm to about 1000 nm along their longest dimension. In some embodiment, the average diameter of the nanoparticles may be agglomerated to sizes of a few tenths of microns (about 50-100 s nm), for example. The size of the nanoparticles may enable good scattering of the light trapped in the passive waveguide out to the viewer. This may be important because the light in the passive waveguide may not be coupled back into the OLED superstructure.

Similarly, the specific materials selected for the glass substrate 156 may also be gleaned from conventional and yet to be developed teachings on the subject. It is noted, however, that the concepts of the present disclosure are well suited for a variety of types of glass including, for example, glasses manufactured in high volumes using, for example, a fusion draw process, and chemically strengthened, ion-exchanged glasses.

The waveguide properties and the optical diffraction mechanisms of the substrate are also affected by the refractive index of the planarization layer. The waveguide layer may have a refractive index at least about 1.7, such as about 1.8 to about 2.1, for example. The geometric properties of an diffraction substructure are optimal when the thickness of the coating mixtures is thicker than the OLED/TCO thickness and when the index of this coating is greater than about 1.7. This is because this ensures that the trapped modes in the OLED superstructure are optically phase matched to the modes in the substructure (coating mixture).

When the refractive index is lower such as about 1.4 or 1.55, for example, the high index nanostructured layer acts as a separate waveguide to which the trapped light in the organic layers can tunnel to. When the planarization layer— refractive index is high, the entire structure: organic layers, TCO, planarization layer, and nanostructure layer may all act in unison as one large waveguide. In this case, the light spreads out and most modes propagate throughout all these layers while being in contact with the metal cathode so that they can be absorbed. So there are effectively two different methods of diffraction.

First, two separate waveguide structures (OLED layer and diffraction layer consisting of a high index coating) are separated by planarization layer with a lower index. In this case, light tunnels to the high index waveguide from where it is then scattered to the environment.

Second, one large waveguide region (OLED layer, diffraction layer consisting of a high index coating and high index planarizer) is also present. In the second case, light propagates throughout the entire 3 medium structure until it is scattered out to the environment.

Figure 2:
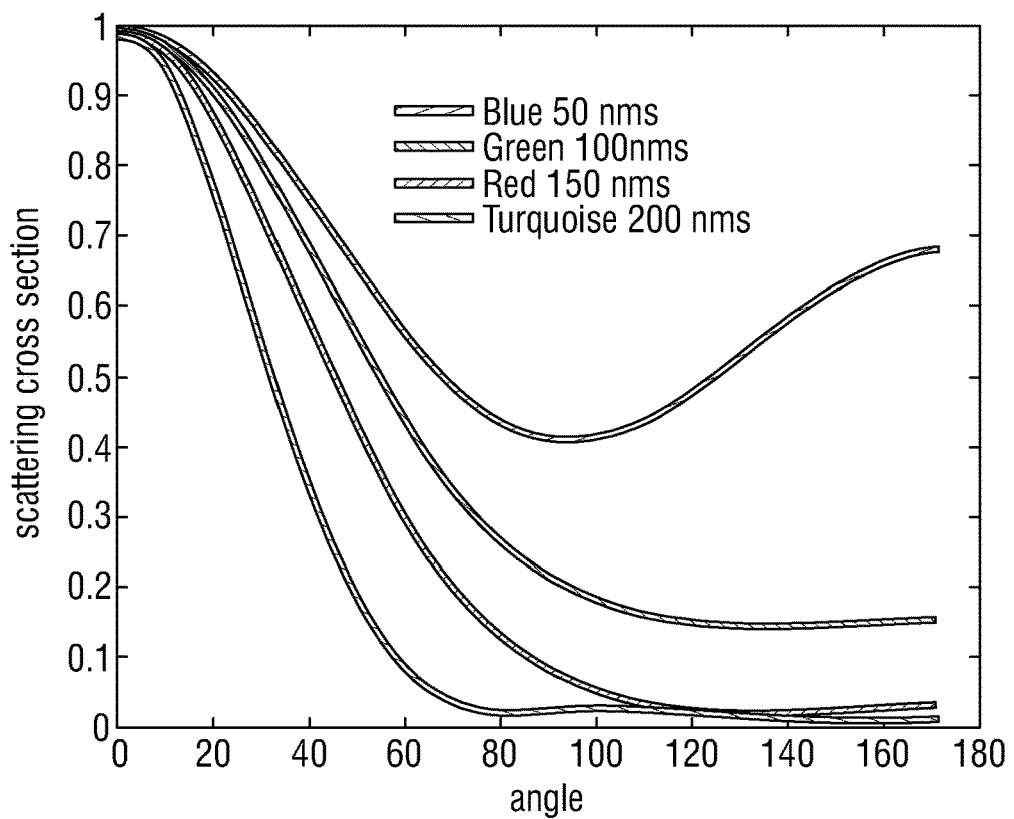
FIG. 2 is a graph showing a volumetric angularly dependent scattering from spheres using the Mie scattering formalism.

Scattering with the Nanostructured Layers:

The volumetric scattering features of the nanostructured layer can be described using Mie scattering theory, which reduces to Rayleigh scattering when the features are much smaller than the wavelength of the light. FIG. 2 shows the volumetric angularly dependent scattering from spheres using the Mie scattering formalism. The model shows that as the scattering particle radius increases, the scattering becomes more forward in angle.

The rough surface scattering of this high index nanostructured layer can be described to first order using the formalism of Beckmann. Beckmann and Andre Spizzichino, The scattering of electromagnetic waves from rough surfaces, Artech House 1987. His theories were developed in order to describe both diffusive and specular scattering from a 100% reflective surface. Springer has modified these theories in order to predict the percentage of diffusively scattered light due to both transmission and reflection at a rough interface based on the refractive index difference at the interface as well as the RMS roughness and a correlation length. J. Springer, A. Poruba, M. Vanecek, Improved three—dimensional model for thin—film silicon solar cells, J. of Applied Physics, 96, #9, 2004

According to Springer $$R_s = fr\left(\text{Exp}\left[-\left(\left(\frac{4\pi}{\lambda}\right)\sigma(n_1)\cos(\theta_1)\right)^2\right]\right)$$

$$R_D = fr(1 - Rs/fr)$$

Where $f_r$ is the reflection fraction and is obtained from Snell's law and $R_S$ and $R_D$ represent the diffusive and specular components.

And $$Ts = fT\left(\text{Exp}\left[-\left(\left(\frac{2\pi}{\lambda}\right)\sigma(n_1 - n_2)\cos(\theta 2)\right)^2\right]\right)$$

$$T_D = f_T(1 - Ts/f_T)$$

Here $T_s$, $T_D$, $f_T$ is the diffusive and specular components of transmission and transmission fraction obtained from Snell's law respectively.

According to this approximation the amount of diffusively vs. specularly scattered light depends on the RMS height while the angularly dependence of the diffusively light depends on both the RMS height and the correlation length.

$$SD \sim \frac{Lc}{2L} * \left(\sum_m \frac{g^m}{m!\sqrt{m}}\text{Exp}\left(-\frac{2\pi}{\lambda}\right)\text{Exp}\left(-\frac{v^2 L_c^2}{4m}\right)\text{Exp}(-g)\right)$$

Here Lc is the correlation length and $g=[(2\pi\sigma/\lambda)*(\cos(\theta_1)+\cos(\theta_2))]^2$ And $\theta_1$ and $\theta_2$ are the input and output angles.

So based on these volumetric and surface scattering models, the key physical parameters can be estimated. Volumetric scattering particles on the order of the wavelength and larger are more forward scattering in angle and become more so with increasing particle radius. Diffusively surface scattering becomes more wide angle when the ratio of the RMS height to correlation length increases. Wide angle scattering or narrow angle scattering with many 'bounces' will both result in diffraction of light. At the same time though light can become more deeply trapped in angle by these same scattering mechanisms. There is a certain randomness to this process if the light can be extracted or more deeply trapped simultaneously until it is either extracted or ultimately absorbed.

Modeling:

A model has been created to determine the fraction of light originating from the high index OLED layer that is coupled to the high index $ZrO_2$ layer. This model is based on a geometrical optics view of the multimode OLED and $ZrO_2$ waveguides combined with the physical optics phenomenon of frustrated total internal reflection providing the coupling efficiency between the OLED and $ZrO_2$ waveguides. In addition, the scalar scattering theory (described above) was used in the model to estimate the amount of the light captured by the $ZrO_2$ waveguide that can be subsequently coupled to the radiation modes of the glass substrate. As an example, showing the importance of the index of refraction of the planarization layer, the following input parameters were used in the model:

OLED index=1.8
$ZrO_2$ index=1.8
$ZrO_2$ roughness (RMS)=0.05 um
Planarization layer thickness=0.5 um
Wavelength=0.55 um
Reflectance of back reflector=92%

Figure 3:
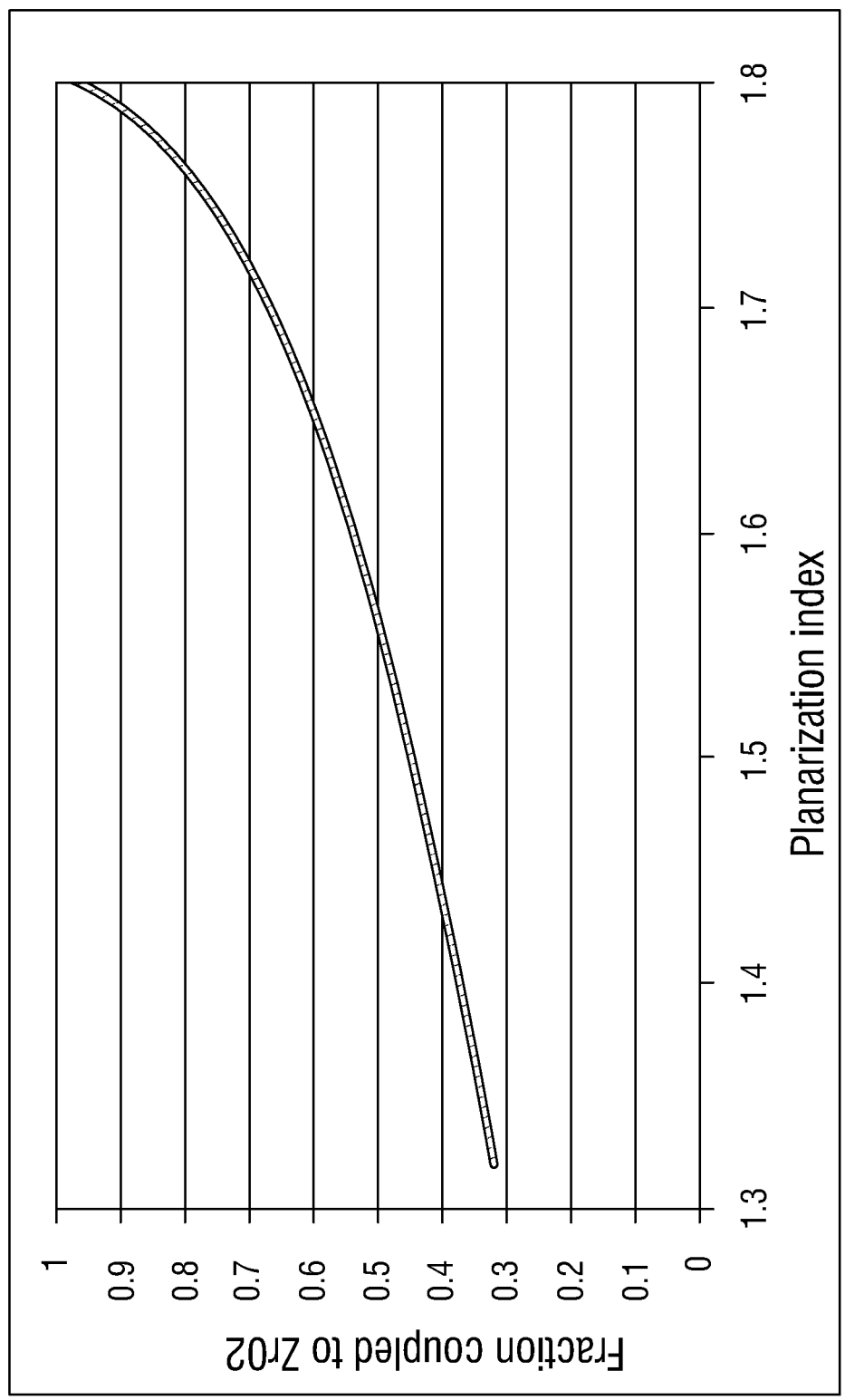
FIG. 3 is a graph showing a light diffraction as a function of planarization layer index according to one embodiment.

The relative benefit on light diffraction as a function of planarization layer index can be seen in FIG. 3. This shows the importance of using a high index for the planarization layer. When the planarization index becomes from about 1.3 to 1.8, the fraction coupled to $ZrO_2$ is from about 0.3 to close to 1.

FIGS. 4a-4d show SEM images of two high index nanoparticle/organo silicon polymer composites: a) $ZrO_2$ nanoparticles/methylsilsesquioxane polymer (Spin on glass e.g. Accuglass 512B) with about 25-35% $ZrO_2$% and b) $ZrO_2$ nanoparticles/phenyl silsesquioxane polymer (e.g. Gelest HardSil AP) with about 18-24% $ZrO_2$%. Images are also where volume fraction of the lower contrast (red) region is calculated using an image analysis software. These films yield about 40-45% as organo silicon or silicate polymer where the calculated effective index is about 1.82-1.85 for this (a) and (b), respectively. The effective index can be increased by using a higher index nanoparticle (e.g. rutile or anatase $TiO_2$) or by increasing the volume fraction of the nanoparticle in the composite.

As seen in FIGS. 4a-4d, the two high index nanostructured particle layers are different in terms of their particle size, morphology and volumetric and surface scattering features. The different arrangement of the layers will result in different scattering mechanisms that will be capable of extracting a significant amount of light. Image analysis measurements of the light extraction substructure is used to quantify the area percent porosity of the nanoparticle coating layer. The area percent porosity of the nanoparticle coating layer is a ratio of the area occupied by the porosity in the nanoparticle coating layer, relative to the area occupied by the entire nanoparticle coating layer.

A cross-section of the light extraction substructure is prepared and SEM images are acquired at the necessary resolution to view the open and/or filled porosity in the nanoparticle coating layer. The grayscale image is segmented to isolate the open and/or filled porosity and quantified to determine the number of image pixels occupied by the porosity, relative to the total number of pixels in the nanoparticle coating layer in a user defined region of interest that encompasses the entire nanoparticle coating layer within the image field-of-view. The user defined region of interest is used to isolate the image pixel area to be analyzed from the rest of the pixels in the image.

Figure 4A:
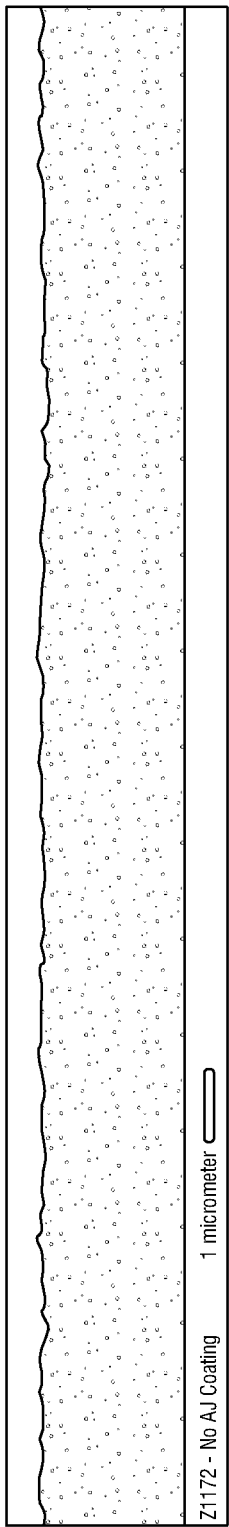
FIG. 4a illustrates a SEM image of $ZrO_2$ nanoparticles with methylsilsesquioxane polymer as coating materials according to one embodiment.
Figure 4B:
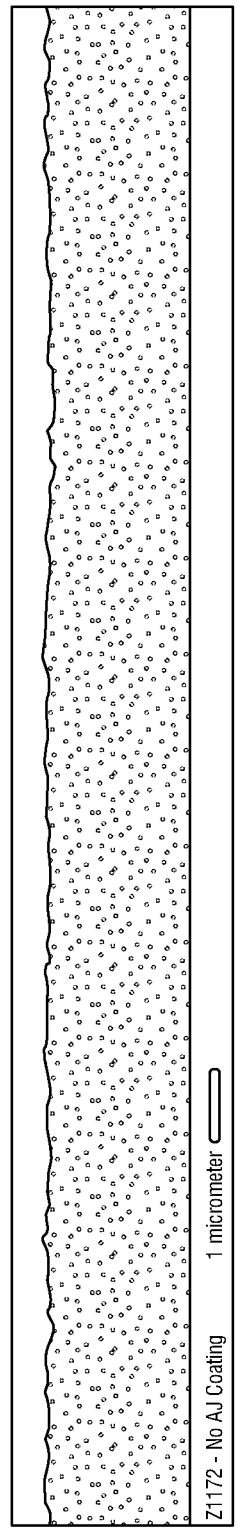
FIG. 4b illustrates a SEM image of $ZrO_2$ nanoparticles with methylsilsesquioxane polymer as coating materials where volume fraction of the lower contrast (red) region is calculated according to one embodiment.
Figure 4C:
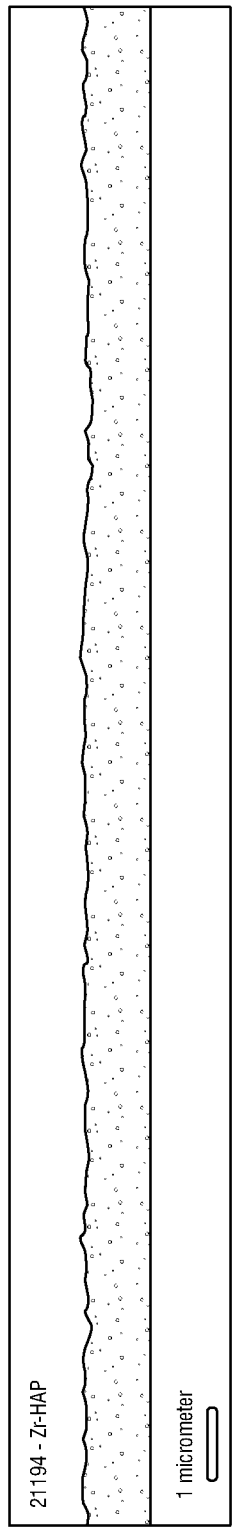
FIG. 4c illustrates a SEM image of $ZrO_2$ nanoparticles with silsesquioxane polymer as coating materials according to another embodiment.

The SEM images shown in FIGS. 4a through 4d show exemplary images of nanoparticle coating layers comprised of nanoparticles and the material used for planarization and the segmented images from the image analysis. In FIGS. 4a and 4c, the contrast in the images is a function of the atomic number of the material being analyzed, where the high atomic number of the high index nanostructured particles will be brighter in contrast than the lower atomic number of the lower index planarizer material. In FIGS. 4a and 4c, the open and/or planarizer filled porosity in the nanoparticle coating layer is represented by the dark contrast regions in the nanoparticle coating layer.

Figure 4D:
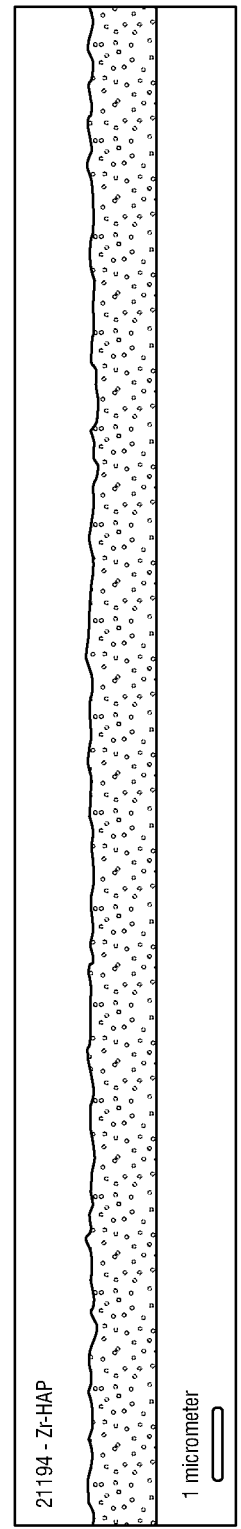
FIG. 4d illustrates a SEM image of $ZrO_2$ nanoparticles with silsesquioxane polymer as coating materials where volume fraction of the lower contrast (red) region is calculated according to one embodiment.

FIGS. 4b and 4d show the same images in FIGS. 4a and 4c after segmenting to isolate the porosity for quantification. The red colored pixels represent the pore space to be quantified within the user defined region of interest. The image analysis procedure quantifies all of the red colored pixels representing the porosity and calculates the image area they occupy, relative to the total number of pixels within the region of interest that represents the entire nanoparticle coating layer. An area percent porosity value is reported.

The nanoparticle distribution shown in the 2-dimensional cross-section image may be representative of the nanoparticle distribution in the 3-dimensional coating layer and that the calculated area percent porosity from the images is representative of the coating. By calculation, the porosity of the porous structure of the waveguide layer is from about 20% to about 60%.

Figure 5A:
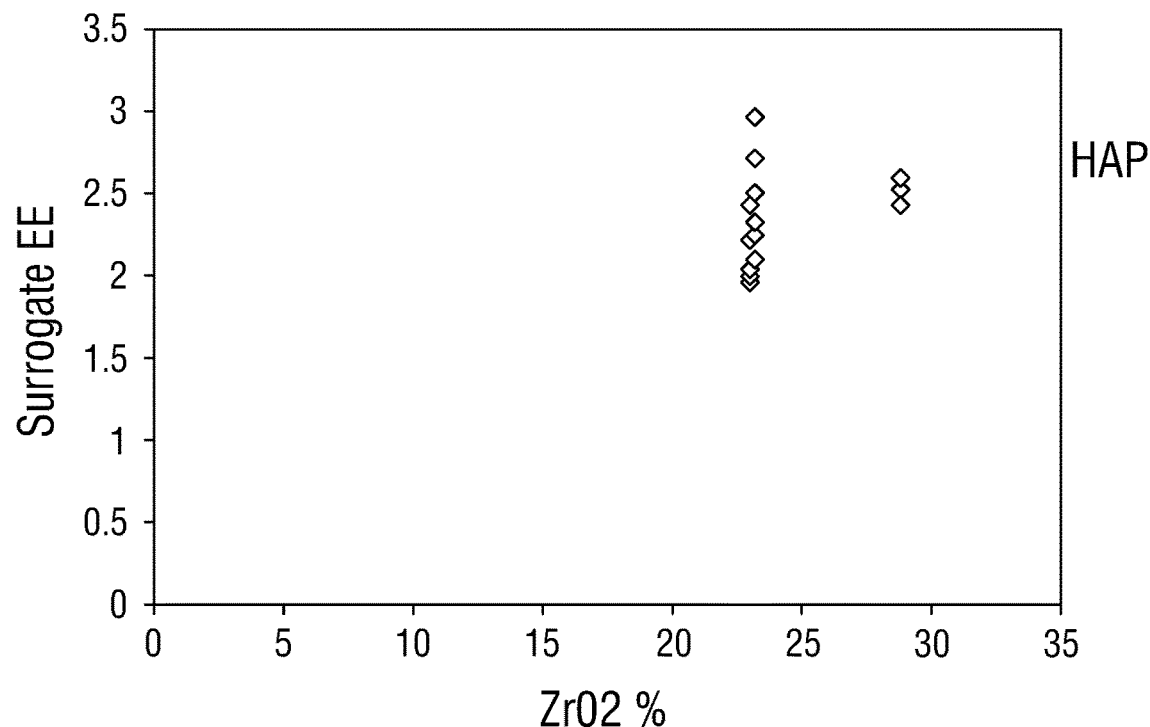
FIG. 5a illustrates surrogate extraction efficiency data on $ZrO_2$ nanoparticles with phenyl silsesquioxane polymer mixtures as a function of the Zirconia content and the organosilicon polymer used for coating.
Figure 5B:
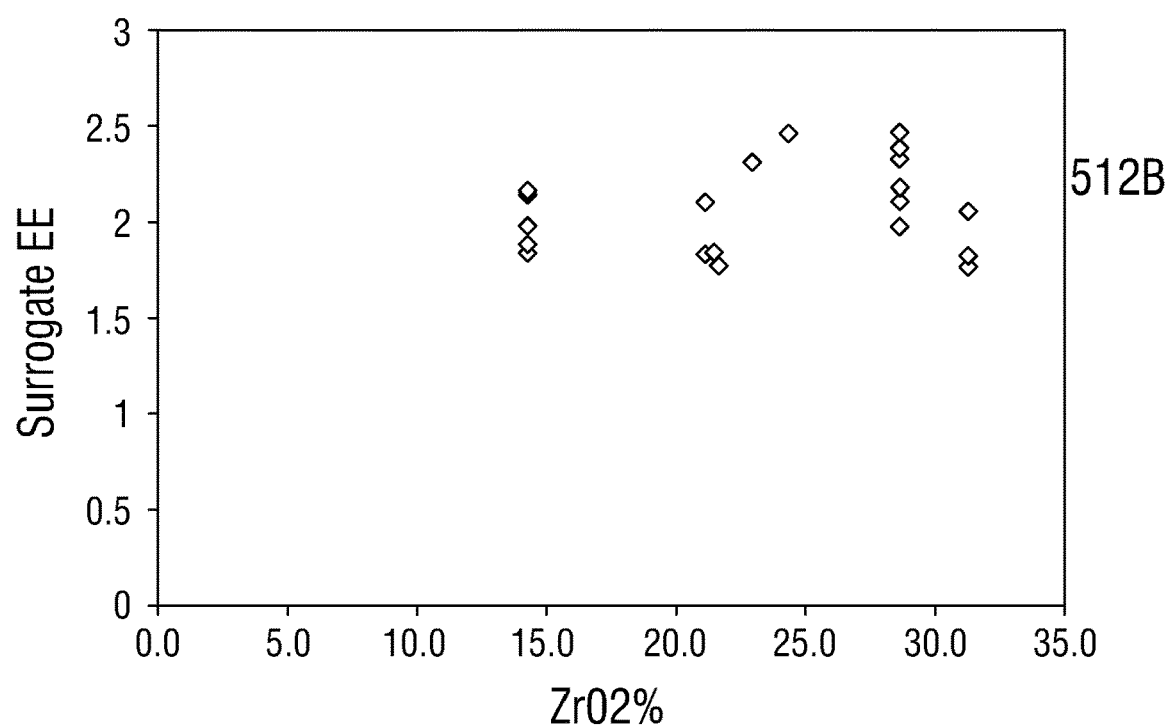
FIG. 5b illustrates surrogate extraction efficiency data on $ZrO_2$ nanoparticles with methylsilsesquioxane polymer mixtures as a function of the Zirconia content and the organosilicon polymer used for coating.

FIG. 5 shows surrogate extraction efficiency data on two types of high index nanoparticle/organosilicon polymer mixtures as a function of the Zirconia content and the organosilicon polymer used for coating.

In the case of HardSil AP (HAP), about 18-30% Zirconia content in the mixture was evaluated and all conditions provided surrogate extraction efficiency values greater than about 1.8 and in some cases as high as 3. These values depend on the coating roughness, porosity and the planarizer layer index and thickness used for reducing the coating roughness.

In the case of 512B, about 25-35% Zirconia content in the mixture was evaluated and most conditions provided surrogate extraction efficiency values >1.8 and as high as 2.5. As mentioned above, these values depend on the coating roughness, porosity and the planarizer layer index and thickness used for reducing the coating roughness.

Figure 6A:
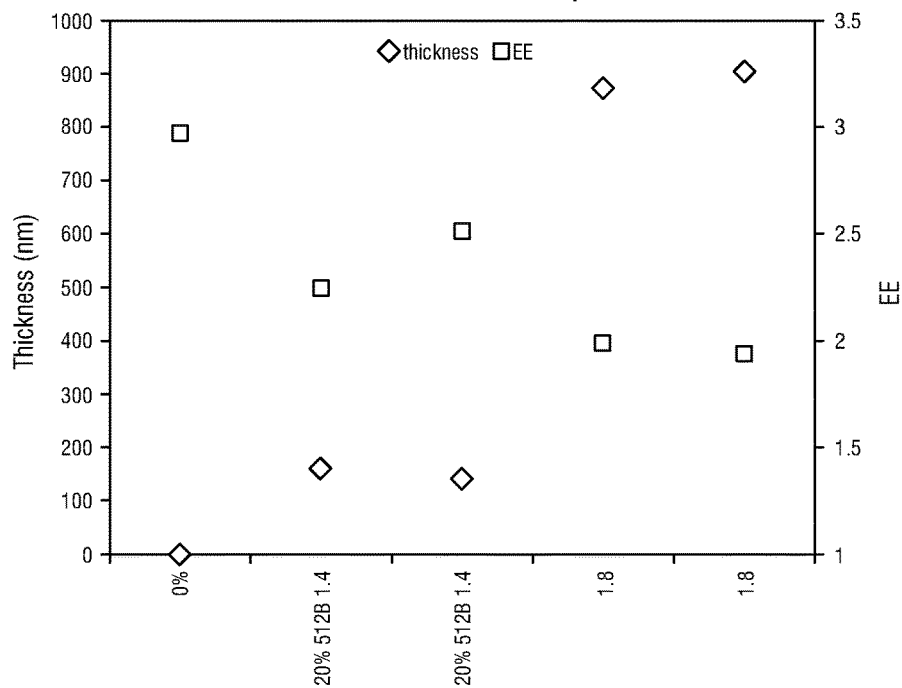
FIG. 6a illustrates surrogate extraction efficiency as a function of the planarizer index and the planarizer thickness on $ZrO_2$ nanoparticles with phenyl silsesquioxane polymer mixtures as coatings.
Figure 6B:
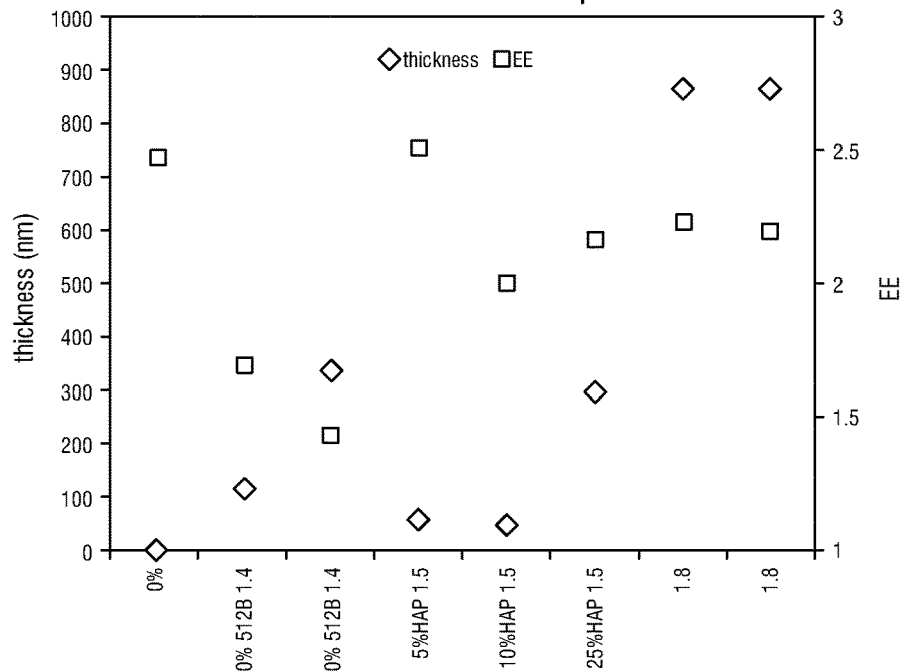
FIG. 6b illustrates surrogate extraction efficiency as a function of the planarizer index and the planarizer thickness on $ZrO_2$ nanoparticles with methylsilsesquioxane polymer mixtures as coatings.

FIG. 6 shows surrogate extraction efficiency as a function of the planarizer index and the planarizer thickness on the two types of high index nanoparticle/organosilicon coatings. In the examples where the lower index planarizer (e.g. n is less than about 1.7) is used, the method of extraction is through the concept of two separate waveguide structures that are separated by planarization layer, where the light tunnels to the high index waveguide and then is scattered by the surface or volumetric scattering features to the environment.

In the examples where the higher index planarizer (e.g. n is more than about 1.7) is used, the method of extraction is through the concept of one large waveguide region. In the second case, light propagates throughout the entire 3 medium structures until it is scattered by the surface or volumetric scattering features out to the environment.

Using $ZrO_2$/512B mixture, the surrogate efficiency value may reach 2.3× for both extraction methods listed above.

In this disclosure, it is noted that the reference herein to respective "sub" and "super" structures are not intended to limit the claimed OLEDs and OLED devices to any particular orientation. Rather, these terms are merely introduced to provide a convenient way to distinguish between two primary parts of the collective assembly.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. For example, FIG. 1 is merely a schematic illustration of the layered structure of an OLED 100 according to one embodiment of the present disclosure. A variety of OLED configurations are contemplated herein, the structural details of which may be conveniently gleaned from the present description, the accompanying drawings, and the appended claims. FIG. 1 is presented for illustrative purposes and is not intended to create a presumption that each of the various aspects illustrated therein is a necessary part of the various embodiments contemplated herein.

The claims appended hereto should be taken as the sole representation of the breadth of the present disclosure and the corresponding scope of the various embodiments described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present disclosure, it is noted that this term is introduced in the claims as an open-ended transitional phrase that is used to introduce a recitation of a series of characteristics of the structure and should be interpreted in like manner as the more commonly used open-ended preamble term "comprising."

It is also noted that recitations herein of "at least one" component, element, etc., should not be used to create an inference that the alternative use of the articles "a" or "an" should be limited to a single component, element, etc.

It is further noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

In this disclosure, it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

While the invention has been described with respect to a limited number of embodiments, those skilled in the art, having benefit of this disclosure, will appreciate that other embodiments can be devised that do not depart from the scope of the invention as disclosed herein. Accordingly, the scope of the invention should be limited only by the attached claims.

What is claimed is:

1. An apparatus for light diffraction, comprising:
a transparent substrate having a refractive index of $n_g$, and
a waveguide layer having a refractive index $n_w$ distributed over of the transparent substrate,
wherein the waveguide layer comprises:
a binding matrix;
a plurality of nanoparticles, wherein the binding matrix and the plurality of nanoparticles together define a porous structure of the waveguide layer having pores therein; and
wherein the waveguide layer has a surface roughness less than about 0.05 microns; and further wherein,
a porosity of the porous structure of the waveguide layer is from about 20% to about 60%, wherein the porosity is defined by the area percent porosity of the binding matrix is a ratio of the area occupied by the porosity in the binding matrix, relative to the area occupied by the entire binding matrix.

2. The apparatus of claim 1, wherein the waveguide layer has an effective refractive index at least about 1.7.

3. The apparatus of claim 1, wherein the waveguide layer has an effective refractive index from about 1.8 to about 2.1.

4. The apparatus of claim 1, wherein the plurality of nanoparticles comprises inorganic nanoparticles.

5. The apparatus of claim 4, wherein the inorganic nanoparticles comprise metal oxides.

6. The apparatus of claim 5, wherein the metal oxides comprise at least one of $ZrO_2$, ZnO, $TiO_2$, $HfO_2$, $Ta_2O_5$, $Al_2O_3$ or their silicates.

7. The apparatus of claim 1, wherein the waveguide layer have surface roughness less than about 0.03 microns.

8. The apparatus of claim 1, wherein the waveguide layer has surface roughness less than about 0.01 microns.

9. The apparatus of claim 1, wherein the transparent substrate comprises a glass substrate.

10. The apparatus of claim 1, further comprising a planarization layer having a refractive index of $n_s$, wherein the waveguide layer is interposed between the transparent substrate and the planarization layer.

11. The apparatus of claim 10, wherein a thickness of the planarization layer is less than about 0.3 microns.

12. The apparatus of claim 10, wherein the planarization layer comprises at least one of silicate or organosilicon materials.

13. The apparatus of claim 10, wherein the waveguide layer further comprises a laminate layer connected to the planarization layer.

14. The apparatus of claim 10, wherein $n_w$ is greater than $n_g$ and $n_w$ is greater than $n_s$.

15. The apparatus of claim 10, wherein the $|n_s-n_d|$ is less than or equal to 0.5.

16. The apparatus of claim 10, wherein the $|n_s-n_d|$ is less than or equal to 0.25.

17. The apparatus of claim 1, further comprising nanoparticles having a size from 2 nm to 20 nm diameter.

18. The apparatus of claim 1, further comprising nanoparticles are agglomerate, the agglomerates having a size from 50 nm to 250 nm diameter.

19. The apparatus of claim 1, wherein the binding matrix comprises a silicate compound, a borate compound, or an organosilyl compound.

20. The apparatus of claim 19, wherein the binding matrix comprises a borate compound.

\* \* \* \* \*

UNITED STATES PATENT AND TRADEMARK OFFICE
CERTIFICATE OF CORRECTION

PATENT NO. : 11,005,075 B2
APPLICATION NO. : 16/140893
DATED : May 11, 2021
INVENTOR(S) : David Eugene Baker et al.

It is certified that error appears in the above-identified patent and that said Letters Patent is hereby corrected as shown below:

In the Claims

In Column 13, Line 3, Claim 15, delete "$|n_s-n_d|$" and insert -- $|n_s-n_g|$ --, therefor.

In Column 13, Line 5, Claim 16, delete "$|n_s-n_d|$" and insert -- $|n_s-n_g|$ --, therefor.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*